United States Patent [19]

Roberts

[11] 4,166,245

[45] Aug. 28, 1979

[54] SIMULTANEOUS DISPLAY OF MULTIPLE CHARACTERISTICS OF COMPLEX WAVEFORMS

[75] Inventor: John H. Roberts, Monroe, Conn.

[73] Assignee: Loft Modular Devices, Inc., Manchester, Conn.

[21] Appl. No.: 851,135

[22] Filed: Nov. 14, 1977

[51] Int. Cl.² .................. G01R 19/16; G01R 19/00
[52] U.S. Cl. .................................. 324/103 P; 324/96; 324/122
[58] Field of Search .............. 324/103 P, 122, 96, 324/102; 307/351

[56] References Cited

PUBLICATIONS

Henry, T.; "An LED-Readout Audio Power Meter"; Popular Electronics; Mar. 1976; pp. 35—38.
Edwards, D.; "LED Level Meter"; Electronics Australia; Jun. 1976; pp. 49, 51, 125.

*Primary Examiner*—Rudolph V. Rolinec
*Assistant Examiner*—Ernest F. Karlsen
*Attorney, Agent, or Firm*—Fishman and Van Kirk

[57] ABSTRACT

Related multiple characteristics of a single complex waveform are displayed as a variable length line of light with a floating spot which moves relative to the line. Logic circuitry, in response to an electrical input signal, causes energization of a plurality of the light emitters in response to the first input signal characteristic and the energization or extinguishing of a single light emitter in response to a second characteristic of the input signal.

9 Claims, 2 Drawing Figures

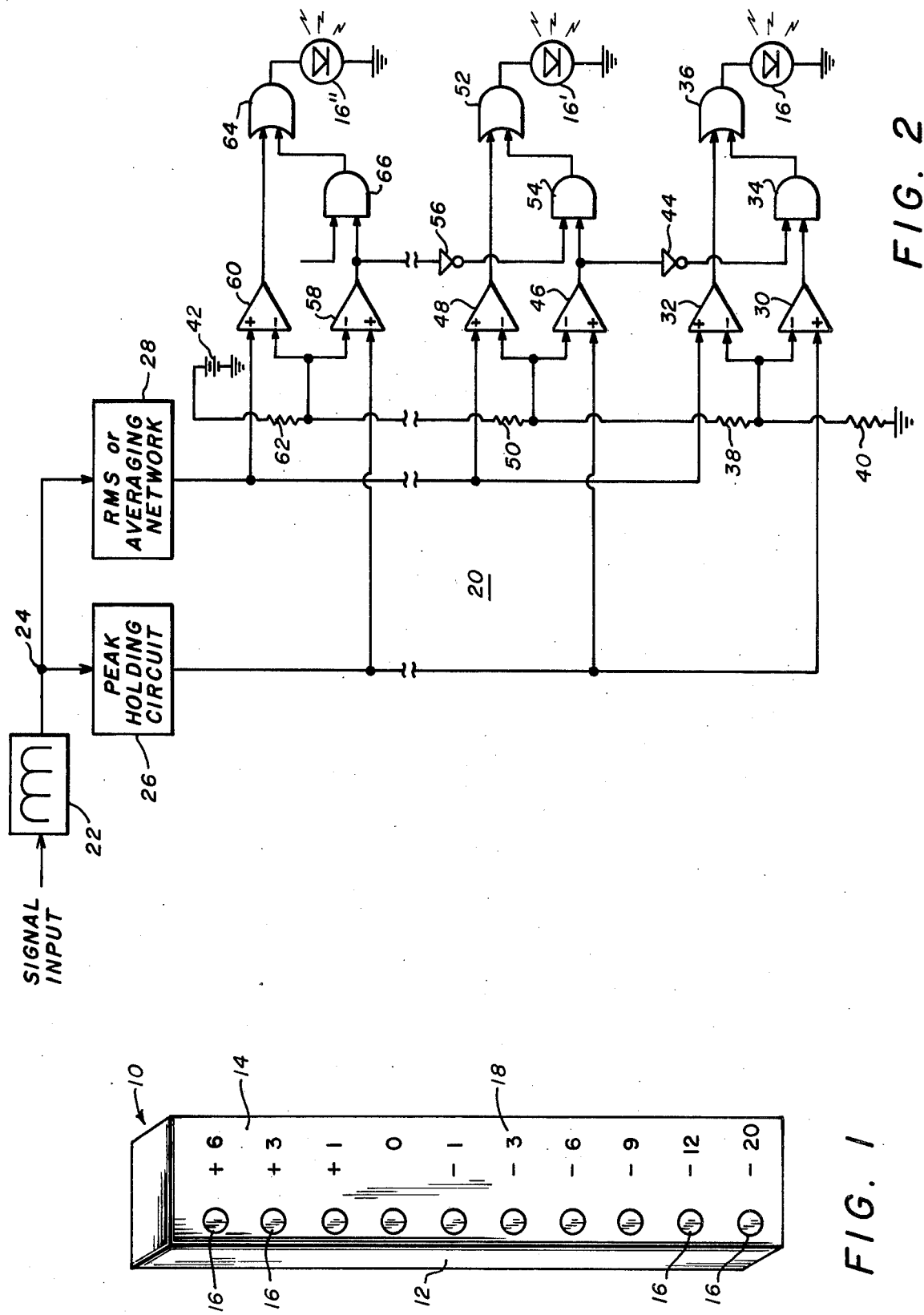

SIMULTANEOUS DISPLAY OF MULTIPLE CHARACTERISTICS OF COMPLEX WAVEFORMS

BACKGROUND OF THE INVENTION:

1. Field of the Invention

The present invention relates to the processing of electrical signals having complex waveforms such as, for example, signals provided by one or more sound responsive transducers. More specifically, this invention is directed to indicators and particularly to an improved meter device which provides an easily interpreted visual display of multiple characteristics of a received signal having a complex waveform. Accordingly, the general objects of the present invention are to provide novel and improved methods and apparatus of such character.

2. Description of the Prior Art

While not limited thereto in its utility, the present invention is particularly well suited for audio frequency signal monitoring or analysis and especially for use in the exercise of control over a recording process where both effective and peak amplitude are of interest. Since the amplitude of an audio waveform may vary faster than the needle of a moving movement meter can track and/or the human eye can follow, two common methods have evolved for quantifying amplitude information for such a complex waveform. The first of these two techniques is "peak reading" wherein an indication of the largest instantaneous amplitude excursion of the signal of interest is stored and displayed with the stored information being continuously updated. The second technique is to provide an indication of the RMS or effective value of the signal waveform. Simultaneous knowledge of both of these parameters is useful during the processing or use of the signal. The effective or RMS amplitude will provide an indication of the loudness or apparent volume of an audio derived input signal while knowledge of the peak amplitude provides useful information vis-a-vis the maximum signal handling capability of the processing equipment or the saturation characteristics of the medium, a magnetic tape for example, on which the signal is being stored.

There has not, in the prior art, been a single instrument having the capability of simultaneously providing an easily interperated display of both effective and peak amplitude of an input signal having a complex waveform.

SUMMARY OF THE INVENTION

The present invention overcomes the above-discussed and other deficiencies and disadvantages of the prior art by selectively energizing a display device having the capability of generating an apparent line or column of light. In accordance with a preferred embodiment, a plurality of light emitting diodes (LED's) are arranged in a linear array and logic circuitry is utilized to energize a plurality of adjacent LED's in accordance with, for example, the RMS or effective value of the magnitude of the input signal. This results in a "column" or line of light having a length commensurate with a first input signal characteristic of interest. Additionally, also under control of the logic circuitry, a single LED will be energized or deenergized as a function of a second input signal characteristic which may, by way of example, be the peak amplitude of the input signal. This results in either a spot of light which "floats" above the illuminated line or column or in a break in the column when the peak is lower than the average value of the first characteristic.

Control circuitry for the array of LED's in accordance with a preferred embodiment includes a peak holding circuit and an RMS or averaging circuit to which the input signal is delivered. Each of the LED's has associated in circuit relation therewith a pair of comparators and, in one embodiment, an AND gate and an OR gate. The outputs provided by the peak holding and averaging circuits are respectively delivered as first inputs to one of the comparators of each pair associated with each LED. A bias voltage is applied to the second inputs to the comparators of each pair. The output of the first comparator of each pair, which will take the form of either a logic "one" or "zero" is connected as an input to the AND gate associated with the corresponding LED. The output of the other comparator of each pair of comparators is connected as an input to the OR gate associated with the corresponding LED. The other input to the OR gate comprises the output from the corresponding AND gate. The second input to the AND gate will be the inverted output of the comparator conneted to the peak holding circuit of an adjacent LED. The output of the OR gate is connected to its associated LED thereby establishing the operating state of the light source.

BRIEF DESCRIPTION OF THE DRAWING

The present invention may be better understood and its numerious objects and advantages will become apparent to those skilled in the art by reference to the accompanying drawing wherein:

FIG. 1 is a perspective view of a meter device employing light emitting diodes and constructed in accordance with a preferred embodiment of the present invention, and FIG. 2 is a functional block diagram of a logic circuit which may be employed in the meter of FIG. 1.

DESCRIPTION OF THE PREFERRED EMBODIMENT

With reference to FIG. 1, a meter in accordance with the present invention is indicated generally at 10. Meter 10 may comprise a housing 12 of generally rectangular configuration. The front wall of housing 12 is defined by a panel 14. Panel 14 is provided with a multiplicity of apertures and light emitting diodes are supported behind panel 14 in registration with these apertures. As illustrated in FIG. 1, the meter 10 is provided with ten LED's 16. It will be understood that panel 14 could be provided with a greater or lesser number of LED's without departing from the essence of the invention. Suitable indicia, as indicated generally by reference numeral 18, are provided on the outer surface of panel 14 adjacent each of the apertures through which the LED's may be viewed.

Referring now to FIG. 2 a logic circuit which may be employed in the practice of the present invention is indicated generally at 20. Logic circuit 20 includes an input element 22. Circuit element 22 may, if the received signal is an electrical signal, comprise a diode for isolation purposes and/or an amplifier. Circuit element 22 provides an input signal to a peak holding circuit 26 and an RMS or averaging network 28. Peak holding circuits are well known in the art and it is not deemed necessary for purposes of obtaining an understanding of the present invention to include herein a detailed description of the construction of peak holding circuit 26. The RMS or averaging network 28 may take several forms. By way of example, RMS network 28 may be a circuit of the type described in the article entitled "True RMS Detector" by Robert C. Dobkin published in Linear Brief-25 in June of 1973.

Continuing with a description of logic circuit 20, the output of peak holding circuit 26 provides a first of the inputs to the control circuitry associated with each LED. In order to facilitate understanding of the invention, only three LED's have been depicted in FIG. 2 at 16, 16" and 16$n$. Similarly, peak holding circuit 26 provides the second input signal for the control circuitry for each of the LED's.

The control circuitry associated with LED 16 includes a pair of comparators 30 and 32, and AND gate 34 and an OR gate 36. Comparators 30 and 32, as is the case with the other compartors to be described below, will provide output signals in the form of either logic "ones" or "zeros". The output of RMS network 28 is connected to the positive input terminal of comparator 32. The output of peak holding circuit 26 is connected to the positive input terminal of compartor 30. The negative input terminals of comparators 30 and 32 are connected to the junction between resistors 38 and 40 of a voltage divider which provides a stepped series of bias voltages to the logic circuit. The voltage divider is connected to a reference voltage source 42.

The output of comparator 32 is connected to one of the input terminals of OR gate 36 while the output of comparator 30 is connected to one of the input terminals of AND gate 34. The other input of AND gate 34 is coupled, via an inverter 44, to the output of comparator 46 associated with diode 16'. The state of the output of OR gate 36 establishes the operating condition; i.e., either on or off; of LED 16.

Referring next to the control for LED 16', the output of RMS network 28 is delivered to the positive input terminal of comparator 48. The output of peak holding circuit 26 is delivered to the positive input terminal of comparator 46. The negative input terminals of comparators 46 and 48 are supplied with a bias voltage from the junction of resistors 50 and 38 of the voltage divider. The output of comparator 46 is connected to one of the input terminals of AND gate 54. The other input to AND gate 54 will be the inverted output of a comparator in the control circuit for the next succeeding diode; the comparator receiving an input from peak holding circuit 26 and the inversion being performed by inverter 56. The output of AND gate 54 is connected to the second input terminal of OR gate 52. The output of OR gate 52 establishes the operating state of LED 16'.

The output of RMS network 28, in the manner described above with respect to the control circuitry for diodes 16 and 16', is connected to the positive input to comparator 60 in the control circuit for diode 16$n$. Similarly, the output of peak holding circuit 26 is connected to the positive input terminal of comparator 58. The negative input terminals of comparators 58 and 60 are tied together and connected to the junction of resistors 62 and 50 of the voltage divider. The output of comparator 60 provides a first input to OR gate 64, the output of comparator 58 provides a first input to an AND gate 66 and the output of AND gate 66 provides a second input to OR gate 64. The second input to AND gate 66 may be a bias voltage source, not shown, capable of providing a logic "one" signal to the gate. Alternatively, AND gate 66 may be omitted entirely from the circuit with the output of comparator 58 being directly to an input to OR gate 64.

To summarize the operation of logic circuit 20 in an audio application, an input signal having a complex waveform, after passage through circuit element 22, is applied to the inputs of peal holding circuit 26 and RMS network 28. The output of peak holding circuit 26 is commensurate with the largest instantaneous amplitude excursion of the input signal while the output of RMS network 28 is commensurate with the effective amplitude of the input signal. These two amplitudes related signals, which are indicative of a pair of characteristics of the complex input waveform, are supplied as inputs to pairs of comparators; the comparator pairs each being associated with a single LED. The other input to each of the comparators of each pair is a bias voltage derived from a constant voltage source by means of a voltage divider. The output from one of the comparators of each pair is supplied as a first input to an OR gate, while the output of the other comparator of each pair will provide a first input to an AND gate. The other input to the OR gate associated with each LED comprises the output of the AND gate. The second input to the AND gate, for all but at least one of the individual LED control circuits, will be an inverted signal commensurate with the state of the output of the peal holding comparator of the control circuit for an adjacent LED. The output of the OR gate establishes the operating state of its associated LED.

As the magnitude of the signal from RMS network 28 varies, the number of first comparators of each comparator pair to provide a logic "one" output to the OR gates will vary as a function of the stepped bias voltages applied to the comparators. This will result in a series of adjacent LED's being energized and the length of the "column" of light thus produced will vary with the output of RMS network 28. As the magnitude of the output signal from peak holding circuit 26 varies, the second comparators of each comparator pair will provide logic "one" inputs to their associated AND gates as the input bias levels of the comparators are exceeded. Due to the inclusion in the circuit of the inverters, only the AND gate corresponding to the comparator which is caused to provide an output as a consequence of the maximum bias signal which is exceeded will provide a signal to an OR gate. The resultant effect will be a "spot" of light which "floats" above the "column".

It is to be noted that the OR gates 36, 52 and 64 may be replaced by exclusive-OR gates. If exclusive-OR gates are employed in the logic circuit, a single LED in the "column" will be extinguished in cases where the instantaneous peak is below the average value of the input signal.

It is also to be noted that the present invention provides a visual output which is reflective not only of the peak and effective amplitude of an input signal, but also an output which provides information as to the ratio which exists between these two related properties. The difference between peak and average amplitude is known in the art as crest factor. In a recording procedure the engineer may, when he observes a high crest factor waveform, elect to apparently overdrive the equipment.

While a preferred embodiment has been shown and described, various modifications and substitutions may be made thereto without departing from the spirit and scope of the invention. By way of example, any linear or bargraph type display, such as a video display, may be employed in place of LED's to represent peak value as a spot moving along a line and average value as a connected bar or line. Acccordingly, it will be understood that the present invention has been described by way of illustration and not limitation.

What is claimed is:

1. Apparatus for simultaneously indicating on a single display at least a pair of characteristics of an electrical input signal having a complex waveform comprising:
    display means, said display means having the capability of providing information by selectively generating light;
    peak holding circuit means, said peak holding circuit means providing an output signal commensurate with the maximum instantaneous amplitude excursion of the input signal;
    averaging circuit means, said averaging circuit means providing an output signal commensurate with the effective amplitude of the input signal;
    means delivering an input signal having a complex waveform to said peak holding circuit and averaging circuit means;
    means generating a stepped series of bias voltages;
    comparator means;
    means delivering bias voltages from said bias voltage generating means to said comparator means;
    means delivering the output signal provided by said averaging circuit means to said comparator means whereby said comparator means provides first output signals commensurate with the difference between said bias voltages and the output signals of said averaging circuit means;
    means delivering the output signal provided by said peak holding circuit means to said comparator means whereby said comparator means provides second output signals commensurate with the difference between said bias voltages and the output signals of said peak holding circuit means;
    logic circuit means connected to receive the output signals of said comparator means, said logic circuit means providing energizing control signals; and
    means delivering the control signals provided by said logic circuit means to said display means to control the display generated thereby.

2. The apparatus of claim 1 wherein said comparator means comprises:
    a plurality of pairs of voltage comparators, the voltage comparators of each pair comparing a different bias voltage from said bias voltage generating means respectively with the output signals from said peak holding and averaging circuit means to provide said first and second output signals.

3. The apparatus of claim 2 wherein said display means comprises:
    an array of light emitters, there being a separate light emitter for each pair of voltage comparators of said comparator means.

4. The apparatus of claim 2 wherein said logic circuit means comprises:
    first gate circuit means connected to recieve as a first input the output signals provided by a first voltage comparator of each pair;
    sacond gate circuit means connected to receive as a first input the output signals provided by a second voltage comparator of each pair;
    means delivering a signal commensurate with the state of the output of a second gate circuit means associtated with a second voltage comparator of another comparator pair as the second input to said second gate circuit means; and
    means delivering the output of said second gate circuit means as the second input to said first gate circuit means connected to the first voltage comparator of the same comparator pair.

5. The apparatus of claim 4 wherein said display means comprises:
    an array of light emitters, there being a separate light emitter for each pair of voltage comparators of said comparator means, said light emitters being controlled by the output state of said first gate circuit means.

6. The apparatus of claim 5 wherein said second gate circuit means are AND gates and wherein said means delivering a second input to said second gate circuit means includes inverter means.

7. A method for simultaneously displaying a pair of characteristics of an electrical input signal having a complex waveform comprising the steps of:
    energizing some of a plurality of adjacently positioned individual light emitters arranged in a light emitter array as a function of a first characteristic of a waveform of interest; and
    simultaneously energizing a single light emitter in the array as a function of a second characteristic of the complex waveform.

8. The method of claim 7 wherein the light emitters of the array are arranged on a line and the light emitter energized as a function of the second characteristic of the complex waveform will not be included in the light emitters energized as a function of the first characteristic.

9. A method for simultaneously displaying a pair of characteristics of an electrical input signal having a complex waveform comprising the steps of:
    comparing the effective amplitude of the waveform with fixed values;
    energizing a plurality of individual light emitters of a linear array in accordance with the result of the comparison of effective amplitude with the fixed values to produce a line of light having a length which varies with a function of the effective amplitude;
    comparing the peak amplitude of the waveform with fixed values; and
    energizing an individual light emitter in the linear array in accordance with the results of the comparison of peak amplitude with the fixed values to thereby generate a visually observable point, said point moving relative to the line of light as the function of the crest factor of the complex waveform.

* * * * *